United States Patent [19]
Hoshen et al.

[11] Patent Number: 6,031,396
[45] Date of Patent: Feb. 29, 2000

[54] CIRCUIT FOR SYNCHRONIZING ASYNCHRONOUS INPUTS USING DUAL EDGE LOGIC DESIGN

[75] Inventors: Eyal Hoshen, Kfar-Saba; Yuri Roytman, Kiryat Ono, both of Israel

[73] Assignee: National Semiconductor Corporation, Santa Clara, Calif.

[21] Appl. No.: 09/097,139

[22] Filed: Jun. 12, 1998

[51] Int. Cl.$^7$ .............................................. H03K 19/0175
[52] U.S. Cl. .................................................. 326/93; 326/46
[58] Field of Search ................................ 326/37, 46, 93, 326/98, 95

[56] References Cited

U.S. PATENT DOCUMENTS

| | | | |
|---|---|---|---|
| 5,036,221 | 7/1991 | Brucculeri et al. | 395/325 |
| 5,047,658 | 9/1991 | Shrock et al. | 395/325 |
| 5,125,089 | 6/1992 | McCambridge | 395/325 |
| 5,321,368 | 6/1994 | Hoelzle | 326/93 |
| 5,379,325 | 1/1995 | Katayama et al. | 326/93 |
| 5,388,225 | 2/1995 | Cantrell et al. | 395/325 |
| 5,432,944 | 7/1995 | Nuckolls et al. | 395/325 |
| 5,487,163 | 1/1996 | Keeley | 395/325 |
| 5,504,441 | 4/1996 | Sigal | 326/93 |
| 5,555,524 | 9/1996 | Castellano | 395/325 |
| 5,566,123 | 10/1996 | Freidin et al. | 395/325 |
| 5,631,577 | 5/1997 | Freidin et al. | 395/325 |
| 5,646,555 | 7/1997 | Morinaka | 326/93 |
| 5,694,588 | 12/1997 | O'Hara | 395/325 |
| 5,726,595 | 3/1998 | Lin et al. | 395/325 |
| 5,731,715 | 3/1998 | Mote, Jr. | 326/93 |

*Primary Examiner*—Michael Tokar
*Assistant Examiner*—Don Phu Le
*Attorney, Agent, or Firm*—Limbach & Limbach L.L.P.

[57] ABSTRACT

A synchronizing circuit processes a plurality (N) of input signals to generate a synchronizing circuit output signal, and provides the synchronizing circuit output signal synchronous to a system clock, wherein the N input signals are asynchronous to the system clock. Input stage circuitry samples the N asynchronous input signals. Combinatorial logic circuitry receives and combines the sampled asynchronous input signals to generate the synchronizing circuit output signal. First polarity edge flip flop circuitry to receive, as first polarity edge flip flop input, a first output of at least a first portion of the combinatorial logic circuitry, wherein the first polarity edge flip flop circuitry processes the first polarity edge flip flop input responsive to a first polarity edge of the system clock signal to provide a first polarity edge processed output signal. Second polarity edge flip flop circuitry to receive, as second polarity edge flip flop input, the second polarity edge processed output signal and to process the second polarity edge flip flop input responsive to a second polarity edge of the system clock signal to provide a second polarity edge processed output signal. The combinatorial logic circuitry includes a second portion to process at least the second polarity edge processed output signal to generate the synchronizing circuit output signal.

5 Claims, 6 Drawing Sheets ically 6,031,396

CIRCUIT FOR SYNCHRONIZING ASYNCHRONOUS INPUTS USING DUAL EDGE LOGIC DESIGN

TECHNICAL FIELD

The present invention relates to circuitry that synchronizes asynchronous inputs and, in particular, to such circuitry that provides a synchronous output responsive to a plurality of asynchronous inputs, with reduced response time.

BACKGROUND

In many electronic systems, it is necessary to generate an output signal that, while synchronized with a system clock signal, is generated based on two or more input signals that are asynchronous to the system clock signal. By "asynchronous", it is meant that these input signals have no predictable relationship to the system clock signal. Many prior art systems can perform this operation, but their solutions generally involves introducing what for some applications is an intolerable delay. In particular, in some applications, it is required that the synchronized output signal be generated within no more than a half period of the system clock duty cycle.

SUMMARY

A synchronizing circuit processes a plurality (N) of input signals to generate a synchronizing circuit output signal, and provides the synchronizing circuit output signal synchronous to a system clock, wherein the N input signals are asynchronous to the system clock. Input stage circuitry samples the N asynchronous input signals. Combinatorial logic circuitry receives and combines the sampled asynchronous input signals to generate the synchronizing circuit output signal. First polarity edge flip flop circuitry to receive, as first polarity edge flip flop input, a first output of at least a first portion of the combinatorial logic circuitry, wherein the first polarity edge flip flop circuitry processes the first polarity edge flip flop input responsive to a first polarity edge of the system clock signal to provide a first polarity edge processed output signal. Second polarity edge flip flop circuitry to receive, as second polarity edge flip flop input, the second polarity edge processed output signal and to process the second polarity edge flip flop input responsive to a second polarity edge of the system clock signal to provide a as second polarity edge processed output signal. The combinatorial logic circuitry includes a second portion to process at least the second polarity edge processed output signal to generate the synchronizing circuit output signal.

DETAILED DESCRIPTION

Figure 1:
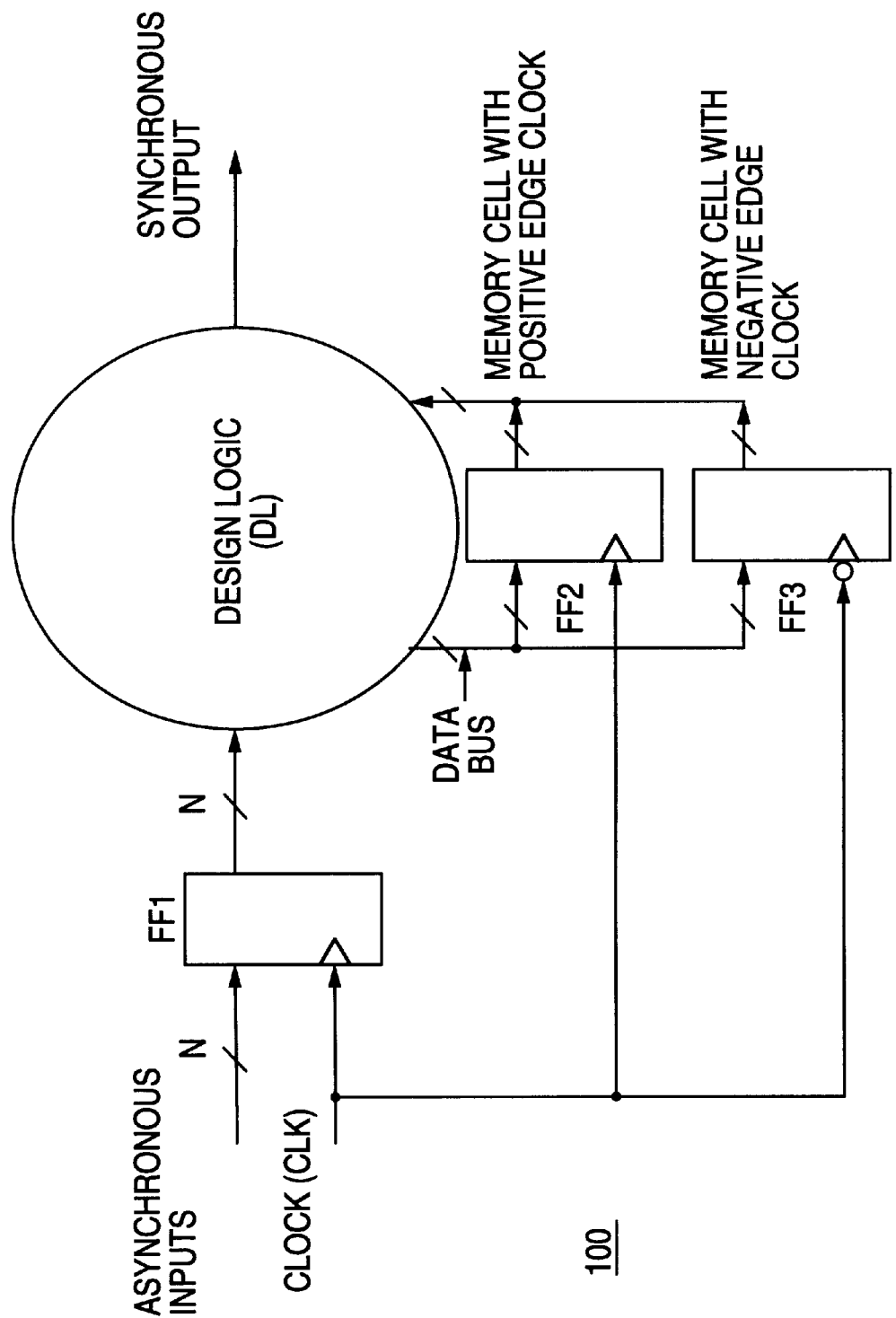
FIG. 1 illustrates a first embodiment 100 in accordance with the present invention.

FIG. 1 is a circuit block diagram of a first embodiment 100 in accordance with the present invention. Before discussing the first embodiment 100 in detail, it is first discussed here in very general terms.

Referring still to FIG. 1, a first positive-edge triggered flip flop stage FF1 is provided for receiving N asynchronous input signals. In practice, the first flip flop stage FF1 includes N separate positive edge triggered flip flops, one for receiving each of the separate N asynchronous input signals. This will be seen later with reference to FIG. 2. The first flip flop stage FF1 102 also receives a system clock signal (CLK) to which the synchronous output of the circuit 100 is synchronized. The system clock signal CLK preferably has a 50% duty cycle.

N outputs are provided from the input stage flip flop FF1 to combinatorial design logic DL. The combinatorial design logic DL does not operate responsive to the system clock signal CLK.

The first embodiment 100 also includes second and third flip flop stages FF2 and FF3, respectively. The system clock signal CLK is also provided to the second and third flip flop stages FF2 and FF3. The constituent flip flops of second flip flop stage FF2 are positive edge triggered. The constituent flip flops of third flip flop stage FF3 are negative edge triggered to cause the synchronous output to be provided. As will be seen by the example embodiment of FIG. 2, though, the output of the flip flops of third flip flop stage FF3 may be further "combined" by portions of the design logic DL before being provided as the synchronous output of the circuit 100.

Figure 2:
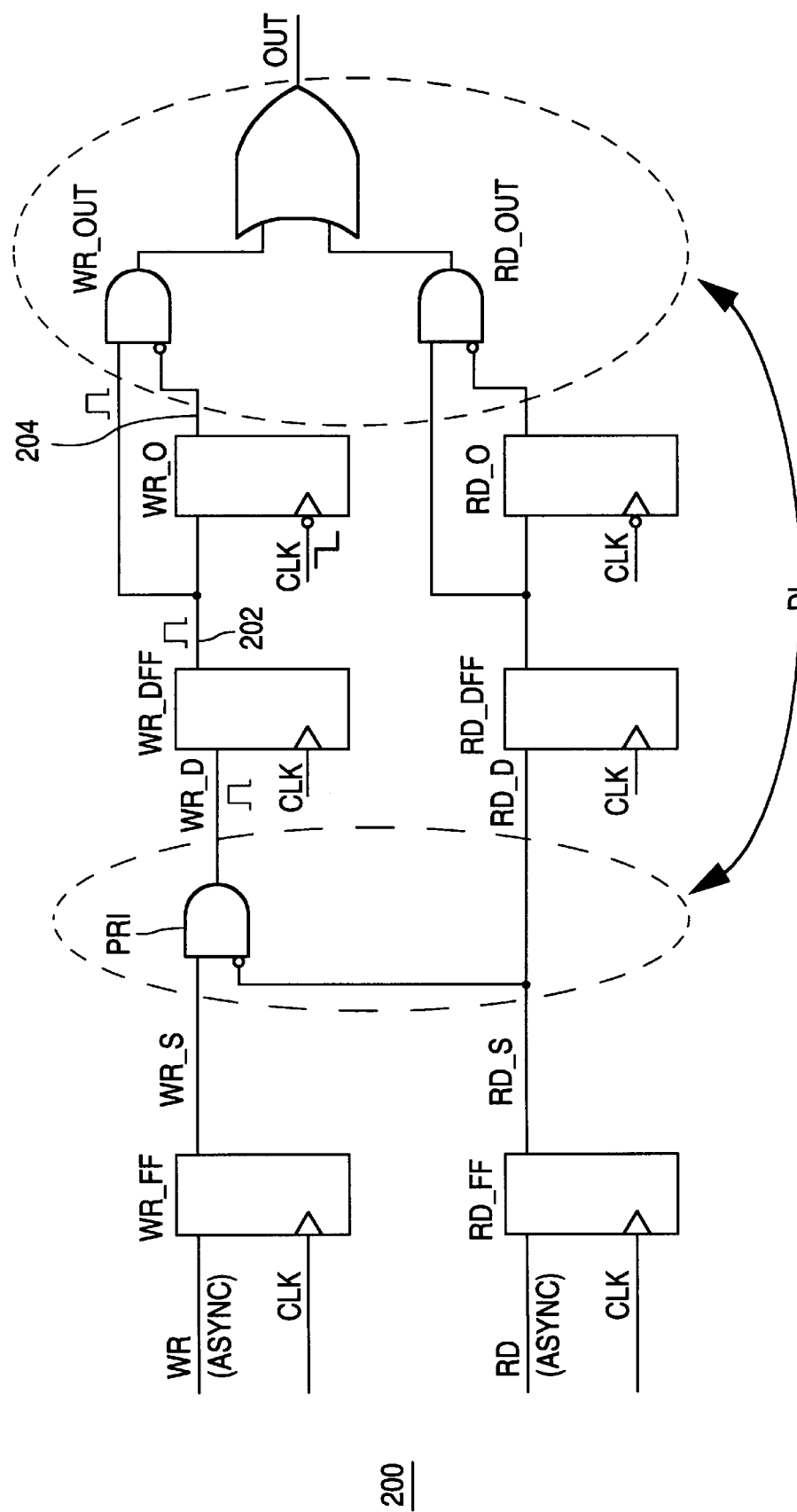
FIG. 2 illustrates in some detail a particular example 200 of the FIG. 1 embodiment 100.

FIG. 2 illustrates in some detail a particular example 200 of the FIG. 1 embodiment 100. The circuit 200 of the FIG. 2 example is for handling independent asynchronous write (WR) and read (RD) inputs. Referring to FIG. 2, the WR and RD signals are provided to flip flops WR_FF and RD_FF, respectively and are clocked through to WR_S and RD_S, respectively, responsive to a positive edge of the system clock CLK. An AND device included as a portion of the design logic DL serves as a priority encoder (designated in FIG. 2 as PRI) so that only one of WR and RD is selected at a time. The RD_S signal is passed on to positive edge triggered flip flop RD_DFF as RD_D, while the output of priority encoder PRI is provided to positive edge triggered flip flop WR_DFF as WR_D.

Negative edge triggered flip flops WR_O and RD_O receive the outputs of positive edge triggered flip flops WR_DFF and RD_DFF, respectively. Notably, as their description implies, flip flops WR_O and RD_O are triggered by negative edges of the system clock CLK. The output of WR_O and RD_O, along with the outputs of WR_DFF and RD_DFF, are provided to design logic DL, which combines the flip flop outputs to generate OUT, the synchronized output signal.

Figure 3:
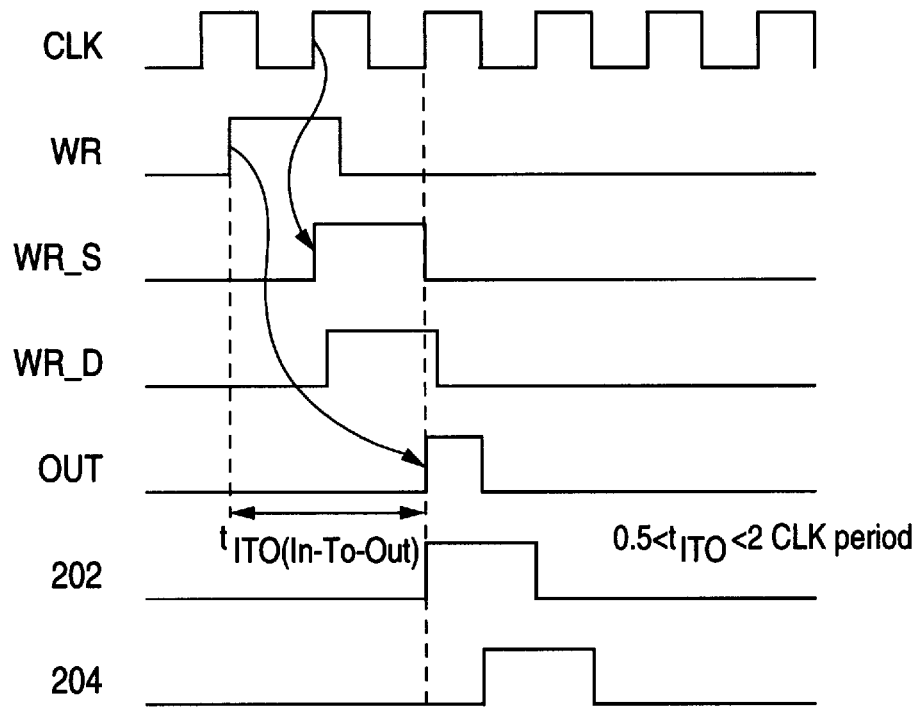
FIG. 3 is a timing diagram that illustrates the operation of the FIG. 2 example 200 in operation.

The operation of the embodiment 200 is now discussed with reference to the timing diagram of FIG. 3. (In operation, when both signals WR_S and RD_S are active, the output WR_D of the AND device PRI is inactive and RD_D is equal to RD_S, and is active. That is, reads have priority.) The WR_S signal is generated on the next positive clock edge of system clock CLK after WR becomes active. WR_D substantially immediately (the amount of time is a function of the propagation delay of the AND device PRI) becomes active. At the next positive edge of system clock CLK, output 202 of WR_DFF becomes active. Then, at the next negative edge of the system clock CLK, output 204 of WR_O becomes active. At this point, WR_OUT (and, thus, OUT) is asserted. As can be seen from the FIG. 3 timing diagram, the maximum response time between a valid input signal and a relevant output signal is two periods of the system clock signal CLK.

Figure 4:
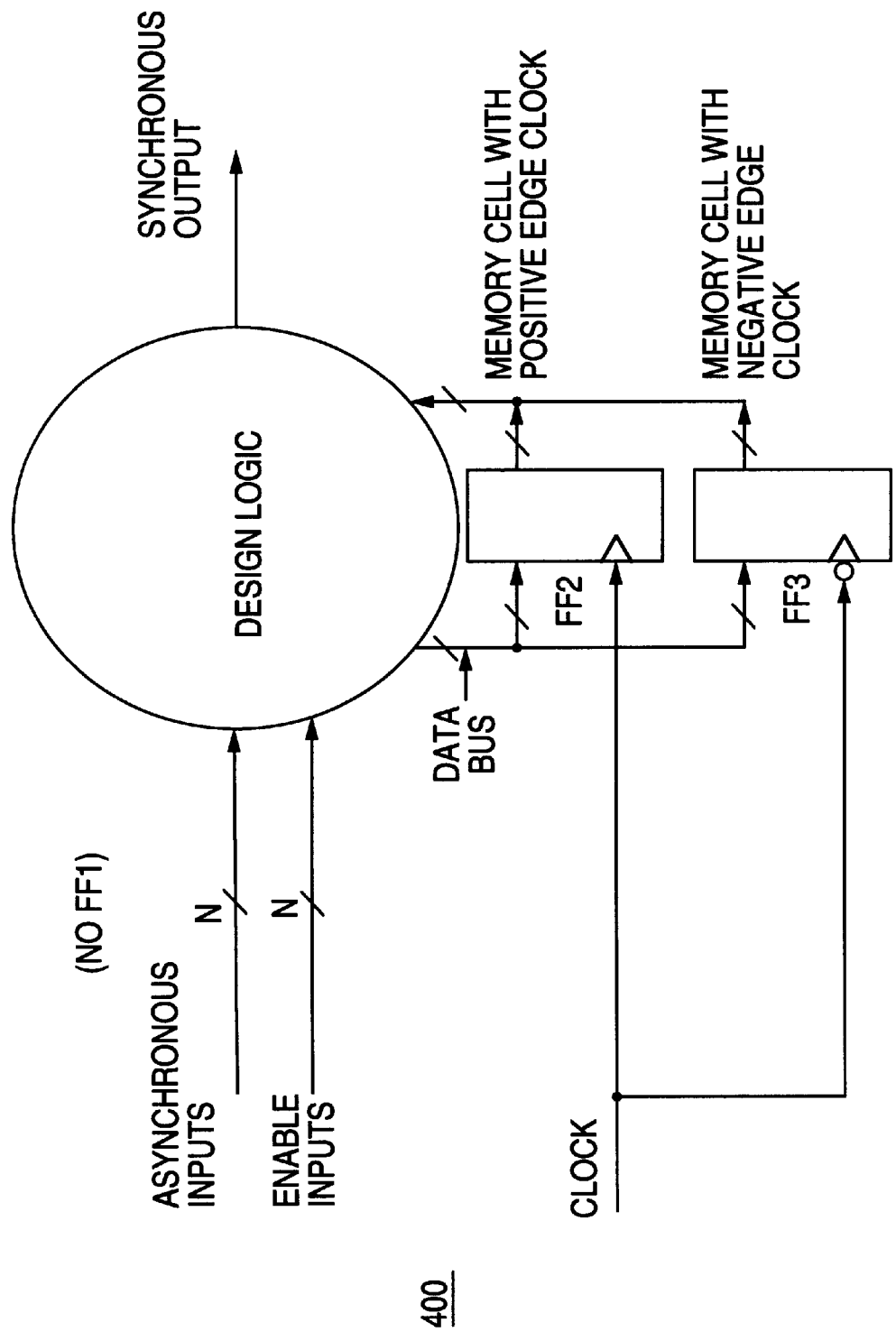
FIG. 4 illustrates an embodiment 400 similar in many respects to the embodiment 100 of FIG. 1, but without an input stage flip flop.

FIG. 4 illustrates an embodiment 400 similar in many respects to the embodiment 100 of FIG. 1. A notable difference between the embodiment 400 and the embodiment 100 is the absence of the input stage flip flop FF1 in the embodiment 400. In FIG. 4, the N enable input signals are synchronous to the system clock signal CLK. It is assumed that an external priority decoder (not shown) asserts only one of the N Enable Inputs at any one time. The N "Asynchronous Inputs" are asynchronous.

Figure 5:
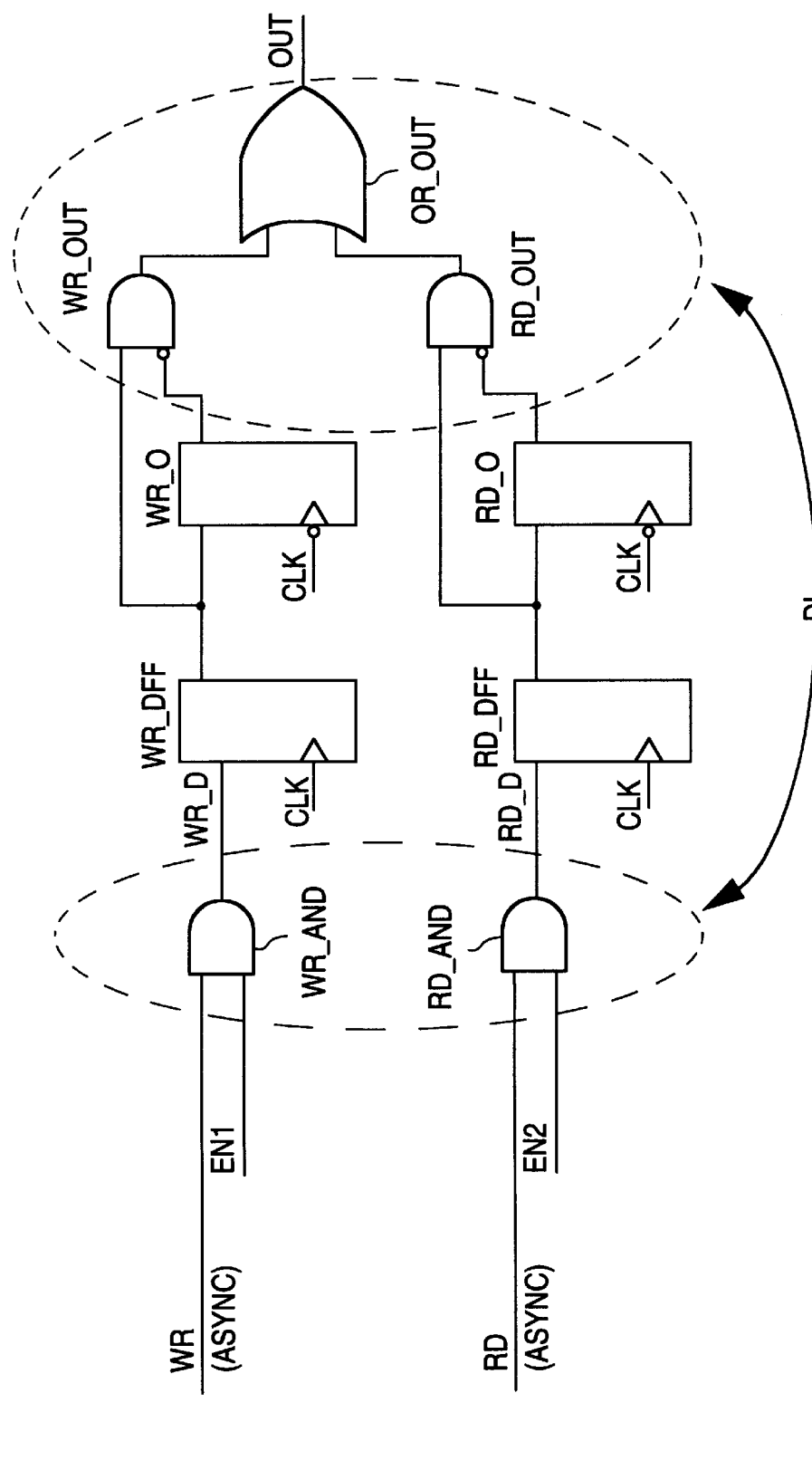
FIG. 5 illustrates in some detail a particular example 500 of the FIG. 4 embodiment 400.

FIG. 5 illustrates in some detail a particular example 500 of the FIG. 4 embodiment 400. The circuit 500 includes AND devices WR_AND and RD_AND to provide the enabled write enable signal WR_D or read enable signal RD_D, respectively. Only the write portion of the circuit 500 is discussed here, since the read portion of the circuit 500 works in a similar fashion. The write enable signal WR_D is provided to a positive-edge triggered flip flop WR_DFF. The write enable signal WR_D is passed through the flip flop WR_DFF at the next positive edge of the system clock CLK. Additionally, the data output of flip flop WR_DFF is connected to the data input of negative edge triggered flip flop WR_O. The output of flip flop WR_DFF and flip flop WR_O are both provided to combinatorial logic DL—specifically, to AND device WR_OUT, which has a non-inverting input to receive the output of the WR_DFF flip flop and an inverting input to receive the output of the WR_O flip flop. An output OR device OR_OUT combines the outputs of the write portion and read portion of the circuit 500 and provides the result as the OUT output signal.

Figure 6:
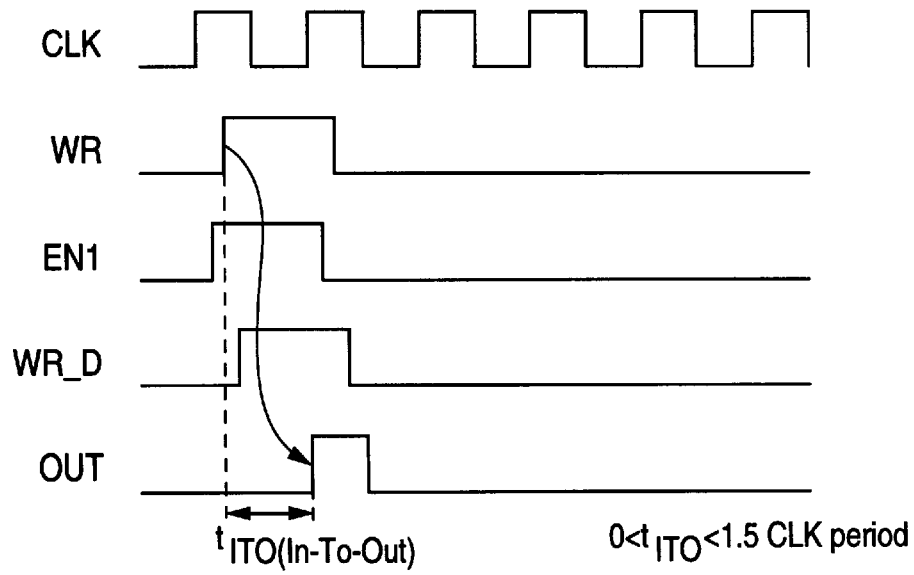
FIG. 6 is a timing diagram that illustrates the timing of the FIG. 5 circuit 500 in operation.

FIG. 6 is a timing diagram that illustrates the timing of the FIG. 5 circuit 500 in operation. As can be seen from FIG. 6, the maximum response time from a valid asynchronous input signal to the relevant output signal is one period of the system clock CLK.

Figure 7:
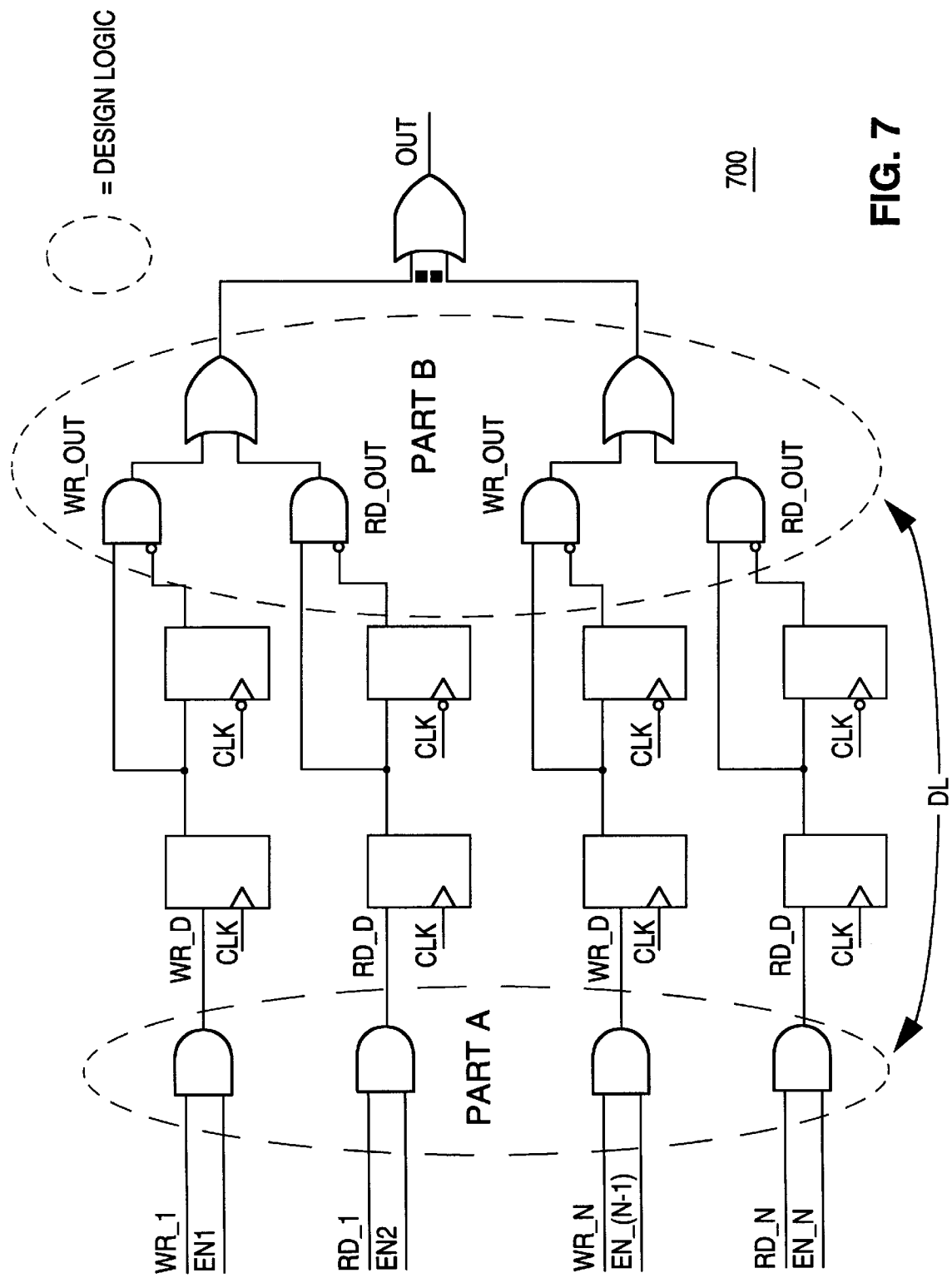
FIG. 7 illustrates in some detail another particular example 700 of the FIG. 4 embodiment 400.

FIG. 7 illustrates in some detail another particular example 700 of the FIG. 4 embodiment 400. As can be seen from FIG. 7, no matter how many inputs are provided (In FIG. 7, inputs WR_1, RD_1 to WR_N, RD_N are provided.), the implementation remains simple. Because the inputs are not sampled (meaning that the input signal is not connected to a flip flop at an input stage, thus being provided to design logic DL, for sampling responsive to a system clock), there is only one path for each input of Part A to the outputs of Part A of the Design Logic DL.

To summarize, particular advantages of the inventive circuits are now reiterated. While prior art circuits synchronize only a single asynchronous input, the inventive circuits described herein can synchronize up to an arbitrary number "N" of asynchronous inputs. While the prior art only synchronizes asynchronous inputs, the inventive circuits incorporate the synchronizing feature as part of its entire design, thus not only synchronizing but also improving timing performance.

What is claimed is:

1. A synchronizing circuit that processes a plurality (N) of input signals to generate a synchronizing circuit output signal, and provides the synchronizing circuit output signal synchronous to a system clock, wherein the N input signals are asynchronous to the system clock, the circuit comprising:

input stage circuitry that samples the N asynchronous input signals;

combinatorial logic circuitry that receives and combines the sampled asynchronous input signals to generate the synchronizing circuit output signal;

first polarity edge flip flop circuitry to receive, as first polarity edge flip flop input, a first output of at least a first portion of the combinatorial logic circuitry, wherein the first polarity edge flip flop circuitry processes the first polarity edge flip flop input responsive to a first polarity edge of the system clock signal to provide a first polarity edge processed output signal;

second polarity edge flip flop circuitry to receive, as second polarity edge flip flop input, the second polarity edge processed output signal and to process the second polarity edge flip flop input responsive to a second polarity edge of the system clock signal to provide a second polarity edge processed output signal;

wherein the combinatorial logic circuitry includes a second portion to process at least the second polarity edge processed output signal to generate the synchronizing circuit output signal.

2. The synchronizing circuit of claim 1, wherein the input stage circuitry includes N input stage flip flop circuits, each of the N input stage flip flop circuits having a data input connected to received a corresponding one of the N asynchronous input signals, a clock input coupled to receive the system clock signal, and an output at which the sampled asynchronous input signal is provided synchronous to a first polarity edge of the system clock.

3. The synchronizing circuit of claim 1, wherein:

the first portion of combinatorial logic circuitry provides N first portion combinatorial outputs, each first portion combinatorial output corresponding to a separate one of the N asynchronous inputs; and the first polarity edge triggered flip flop circuitry includes N first polarity edge triggered flip flop circuits, each including:

an input for receiving a separate one of the N first portion combinatorial outputs;

a clock input for receiving the system clock signal; and a data output at which the received first portion combinatorial output is provided to the second polarity edge flip flop circuitry, as a first polarity edge triggered flip flop output, responsive to the first polarity edge of the system clock at the clock input.

4. The synchronizing circuit of claim 3, wherein:

the second polarity edge triggered flip flop circuitry includes N second polarity edge triggered flip flop circuits, each including:

an input for receiving a separate corresponding one of the N first polarity edge triggered flip flop outputs;

a clock input for receiving the system clock signal; and a data output at which the received one of the N first polarity edge triggered flip flop outputs is provided to the second portion of the combinatorial circuitry, as a second polarity edge triggered flip flop output, responsive to the second polarity edge of the system clock at the clock input.

5. The synchronizing circuit of claim 4, wherein:

the second portion of combinatorial circuitry includes:

N second portion combinatorial circuits, each combining a separate corresponding one of the N second polarity edge triggered flip flop outputs with the one of the N first polarity edge triggered flip flop outputs corresponding thereto;

a master combining circuit that combines together the outputs of the N second portion combinatorial circuits to generate the synchronizing circuit output signal.

* * * * *